United States Patent
DeBrosse et al.

(10) Patent No.: US 8,901,529 B2
(45) Date of Patent: Dec. 2, 2014

(54) MEMORY ARRAY WITH SELF-ALIGNED EPITAXIALLY GROWN MEMORY ELEMENTS AND ANNULAR FET

(71) Applicant: International Business Machines Corporation, Armonk, NY (US)

(72) Inventors: John K. DeBrosse, Colchester, VT (US); Chung H. Lam, Peekskill, NY (US); Janusz J. Nowak, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/834,998

(22) Filed: Mar. 15, 2013

(65) Prior Publication Data

US 2014/0264510 A1    Sep. 18, 2014

(51) Int. Cl.
| | | |
|---|---|---|
| H01L 29/02 | (2006.01) | |
| H01L 47/00 | (2006.01) | |
| H01L 27/115 | (2006.01) | |
| H01L 27/22 | (2006.01) | |

(52) U.S. Cl.
CPC ..... *H01L 27/11507* (2013.01); *H01L 27/11521* (2013.01); *H01L 27/222* (2013.01)
USPC .......................................................... 257/2

(58) Field of Classification Search
CPC .................. H01L 27/11502; H01L 27/11514; H01L 27/11507; H01L 43/05; H01L 28/55; H01L 27/222; H01L 27/22521
USPC .......................................................... 257/2
See application file for complete search history.

(56) References Cited

U.S. PATENT DOCUMENTS

| | | | | |
|---|---|---|---|---|
| 5,525,819 | A | 6/1996 | Yarbrough | 257/275 |
| 6,156,611 | A | 12/2000 | Lan et al. | 438/268 |
| 6,951,789 | B2 | 10/2005 | Voshell et al. | 438/241 |
| 7,109,539 | B2 | 9/2006 | Lu | 257/295 |
| 7,508,041 | B2 | 3/2009 | Noh et al. | 257/422 |
| 7,742,328 | B2 | 6/2010 | Chen et al. | 365/158 |
| 8,026,561 | B2 * | 9/2011 | Saito et al. | 257/421 |
| 8,300,454 | B2 * | 10/2012 | Kramer et al. | 365/171 |
| 8,519,431 | B2 * | 8/2013 | Nemati et al. | 257/110 |
| 8,575,686 | B2 * | 11/2013 | Masuoka et al. | 257/329 |
| 2007/0230242 | A1 | 10/2007 | Lee et al. | 365/173 |
| 2012/0248529 | A1 | 10/2012 | Liu et al. | 257/334 |

OTHER PUBLICATIONS

W. J. Gallagher et al., "Development of the magnetic tunnel junction MRAM at IBM: From first junctions to a 16-Mb MRAM demonstrator chip," IBM J. Res. & Dev. vol. 50, No. 1, Jan. 2006, pp. 5-23A.

* cited by examiner

Primary Examiner — William D Coleman
(74) Attorney, Agent, or Firm — Ido Tuchman; Vazken Alexanian

(57) ABSTRACT

A system and method for fabricating a memory array device. An example memory array device includes a plurality of memory cells, each including a FET over a substrate and a memory element over the FET. Each memory element includes a plurality of epitaxially grown memory element layers. The memory array device includes a plurality of gate conductors configured a first axis, in parallel. Each gate conductor laterally surrounds a plurality of FETs of the memory cells along the first axis. The memory array device includes a plurality of bit lines configured along a second axis, in parallel, and electrically coupled to a plurality of memory elements along the second axis. Embodiments of the memory array preserve alignment of crystal lattices beginning from the bottom layers in the FET up to the top active layers in memory element, thus preserving crystal lattice alignment between transistor and memory element.

18 Claims, 11 Drawing Sheets

MEMORY ARRAY WITH SELF-ALIGNED EPITAXIALLY GROWN MEMORY ELEMENTS AND ANNULAR FET

BACKGROUND OF INVENTION

The present invention relates to memory array devices. More particularly, the present invention relates to the structure and fabrication of memory element layers in non-volatile memory array devices.

Typical non-volatile memory array devices consist of memory cells fabricated on semiconductor substrates. The memory cells in such memory array devices generally consist of memory elements and field effect transistors (FET) electrically coupled to word-lines and bit-lines.

Spin Torque Transfer (STT) Magnetoresistive Random Access Memory (MRAM) is an attractive emerging memory technology, offering non-volatility, high performance and high endurance. The STT MRAM memory cell typically consists of a Magnetic Tunnel Junction (MTJ) in series with a word-line-gated field effect transistor, and with a bit-line at one or both ends. If only one end of the cell is connected to a BL, the other is connected to a mid-level voltage (Vmid). Conventionally, the FET is constructed within a silicon substrate and the MTJ is constructed between two subsequent wiring levels. The contacts, landing pads, and wiring conflicts associated with this structure decrease density, yield and reliability. Additionally, the trend of increasing density presents conflicts with performance, yield and reliability of the memory elements.

SUMMARY OF INVENTION

An aspect of the present invention is a memory array device comprising a plurality of memory cells. Each memory cell includes a FET on top of a substrate and a memory element electrically coupled to the FET. Each memory element includes a plurality of memory element layers, which are each epitaxially grown. The memory array device also includes a plurality of gate conductors configured along a first axis, parallel to one another. Each gate conductor laterally surrounds a plurality of FETs along the first axis. The memory array further includes a plurality of bit lines configured along a second axis, parallel to one another and perpendicular to the gate conductors. Each bit line is electrically coupled to a plurality of memory elements along the second axis.

Another aspect of the invention is a method for fabricating a memory array device. The method includes forming a plurality of FET layers over a substrate. The method also includes forming a plurality of memory element layers over the FET layers, such that each memory element layer is epitaxially grown. The method further includes forming a plurality of memory cell pillars by etching through portions of the memory element layers and FET layers, such that each memory cell pillar includes a FET and a memory element. The method also includes forming a plurality of gate conductors configured along a first axis, parallel to one another. Each gate conductor laterally surrounds a plurality of FETs along the first axis. The method includes forming a plurality of bit lines configured along a second axis, parallel to one another. Each bit line is electrically coupled to a plurality of memory elements along the second axis, perpendicular to the first axis.

DETAILED DESCRIPTION

The present invention is described with reference to embodiments of the invention, but shall not be limited to the referenced embodiments. Throughout the description of the present invention, references are made to FIGS. 1 through 11.

It is initially noted that the environments described below and depicted in the figures are for the purpose of illustrating suggested embodiments of the present invention. Thus, the present invention should not be construed as limited to the environment configurations shown and discussed herein. Therefore, the present invention encompasses alternative orientations and configurations of the suggested embodiments.

Additionally, relative terms, such as "top", "down", "above", and "over" are employed with respects to other elements in the described embodiments and figures. Such terms are meant only to describe the referenced embodiments. Likewise, the figures include references to a first axis and a second axis from the claimed elements, however, the spirit of the invention is not limited by the orientations of such axis in the provided embodiments. Therefore, the present invention encompasses alternative orientations and configurations of the suggested embodiments.

Embodiments of the present invention provide possible configurations for a memory array device, and possible methods for fabricating such a memory array device. For high density MRAM memory array, all layers in magnetic tunnel junctions need to be atomically flat and have uniform thickness across all the devices. Currently, MRAM cells are typically built on top of all CMOS layers and, as a result, magnetic tunnel junctions have polycrystalline layers with random orientations of crystals. This causes a large cell to cell variation in both electric and magnetic properties of individual cells. All these cell to cell variations can be overcome by growing a MTJ stack epitaxially layer by layer on mono-crystalline semiconductor surface (Si, Ge). Additional epitaxial seed layers or etch stop layers can be used for various proposes for easier manufacturing.

Figure 1:
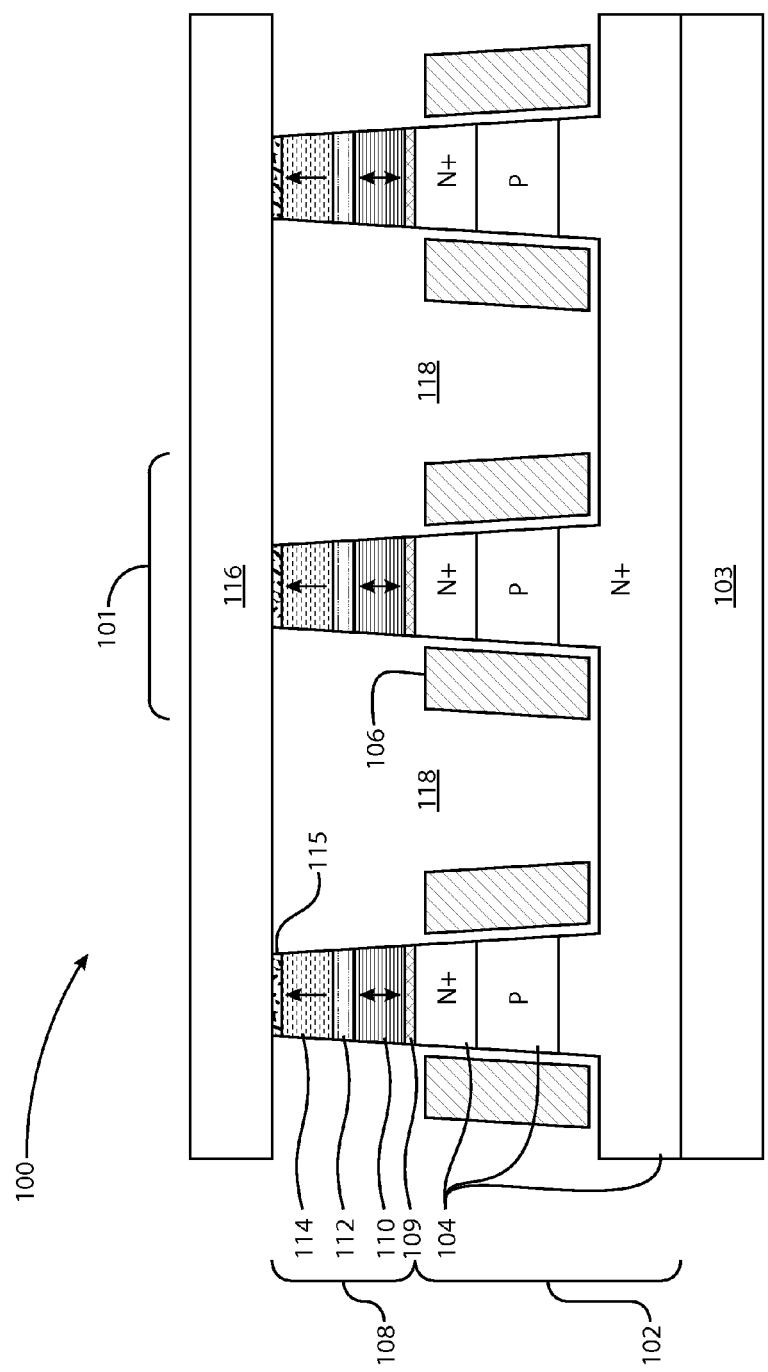
FIG. 1 depicts a cross-sectional view of a memory array device, in accordance with one embodiment of the present invention.

FIG. 1 depicts a cross-sectional view of a memory array device 100 in accordance with one embodiment of the present invention. The memory array device 100 includes a plurality of memory cells 101. Each memory cell 101 includes a field effect transistor (FET) 102 and a memory element 108. The FET 102 includes a plurality of FET layers 104 over a substrate 103. In the preferred embodiment, the FET layers 104 are each epitaxially grown. The FET layers 104 include alternating layers of n-type doped silicon and p-type silicon.

The memory element 108 is electrically coupled to the FET 102. Each memory element 108 includes a plurality of epitaxially grown memory element layers. In some embodiments, the memory element 108 is a Spin Torque Transfer (STT) Magnetoresistive Random-Access Memory (MRAM) cell. In such embodiments, the memory element 108 includes a magnetic tunnel junction (MTJ), which includes a free-magnetic layer 110, a tunnel barrier 112, and a fixed-magnetic layer 114. In some embodiments, the crystalline structure of the free-magnetic layer 110 is aligned epitaxially to the FET layer below. The free-magnetic layer 110 and fixed-magnetic layer 114 may be comprised of ferromagnetic materials, cobalt iron boron (CoFeB), cobalt nickel (CoNi), iron boron (FeB), etc. The fixed-magnetic layer 114 may also include antiferromagnetic materials, such as cobalt iron (CoFe), iron nickel (FeNi), nickel oxide (NiO), etc. The tunnel barrier 112 may be comprised of insulating or semiconducting materials, such as magnesium oxide (MgO), aluminum oxide (AlO), hafnium oxide (HfO), iron oxide (FeO), bismuth iron oxide (BiFeO), etc.

Embodiments of the present invention preserve alignment of crystal lattices beginning form the bottom layers in the transistor 102 up to the top active layers in memory element, thus preserving crystal lattice alignment between the transistor 102 and the memory element 108. Such a structure is in short defined as heteroepitaxial. Embodiments of the memory array preserve alignment of crystal lattices beginning from the bottom layers in the FET up to the top active layers in memory element, allowing for high yielding gigabit memory arrays composed of almost identical electrically and magnetically cells.

In this embodiment, a seed layer 109 exists between the FET 102 and the memory element 108. The seed layer 109 includes many sub-layers, some sub-layers may only be atomically thick and not continuous. For example, a first sub-layer may provide ohmic contact, a second sub-layer may compensate for crystal lattice mismatch and a third sub-layer may promote perpendicular anisotropy in the free-magnetic layer 110. The sub-layers may be comprised of many materials including but not limited to aluminum (Al), magnesium oxide (MgO), nickel silicide (NiSi), and cobalt silicide (CoSi). Additionally, there may be several monolayers in between the sub-layers. The monolayers configured to promote layer by layer growth of the whole structure.

In this embodiment, the free-magnetic layer 110 is situated above the FET 102, the tunnel barrier 112 over the free-magnetic layer 110, and the fixed-magnetic layer 114 situated above the tunnel barrier 112. However, it should be noted that alternate embodiments may exist wherein the free-magnetic layer 110 is situated over the tunnel barrier 112, the tunnel barrier 112 over the fixed-magnetic layer 114, and the fixed-magnetic layer 114 situated over the FET 102.

The memory array device 100 also includes a plurality of gate conductors 106 configured along a first axis (running in and out of FIG. 1), parallel to one another. In this embodiment, the gate conductors 106 are utilized as the conductive channels of the word lines. Each gate conductor 106 is self-aligned to laterally surround a plurality of FET 102 of the memory cells 101 along the first axis. As such, each FET 102 is configured as an annular FET. One skilled in the arts would recognize that the gate conductors 106 may include any number of conductive materials. As such, the gate conductors 106 provide electrical coupling of adjacent memory cells along the first axis. It should be noted that a thin gate oxide may be situated between the gate conductor 106 and the FET 102.

The memory array device 100 also includes a plurality of bit lines 116 configured along a second axis (running horizontally across FIG. 1), parallel to one another. Each bit line 116 is electrically coupled to a plurality of memory elements 108 of the memory cells along the second axis. The second axis being perpendicular to the first axis.

Additionally, the memory array device 100 may include a metallic cap layer 115 between the memory element 108 and the bit lines 116. The metallic cap layer 115 configured to protect the memory element 108 from damage during fabrication. One skilled in the arts would recognize that the metallic cap layer 115 may be comprised of any number of conducting materials.

The space between the memory cells 101 is filled with a filler layer 118. The filler layer 118 may be comprised of any number of insulating materials. In this embodiment, the space between the gate conductors 106 is substantially less than the space between the bit lines 116.

Figure 2:
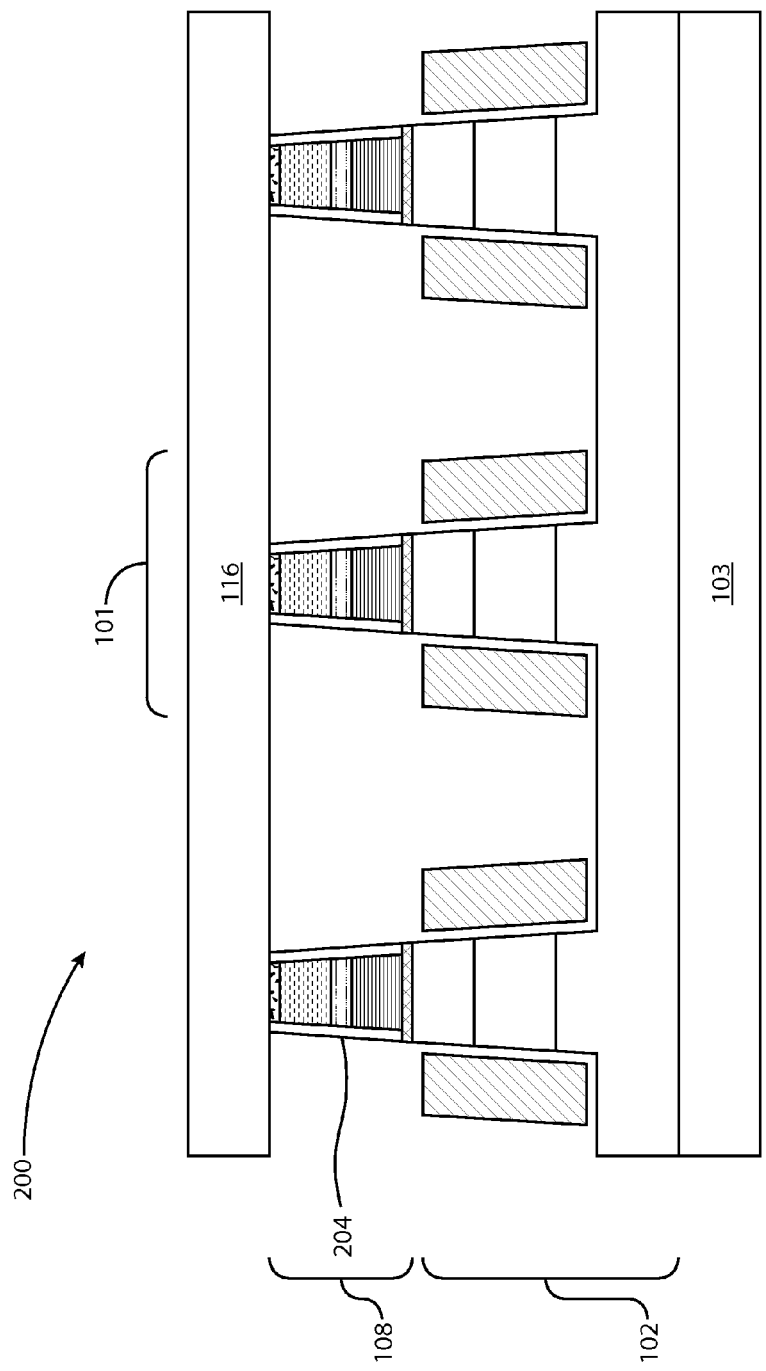
FIG. 2 depicts a cross-sectional view of a memory array device, in accordance with one embodiment of the present invention.

FIG. 2 depicts a cross-sectional view of a memory array device 200, in accordance to one embodiment of the present invention. This embodiment includes an encapsulation layer 204 surrounding the memory element 108. The encapsulation layer 204 may be configured to protect the memory element 108 during the etch processes. Additionally, the encapsulation layer 204 may be configured to decrease the capacitance between the memory element 108 and the gate conductors 106. In some embodiments, the diameters of the FETs 102 are substantially greater than the diameters of the memory elements 108.

Figure 3:
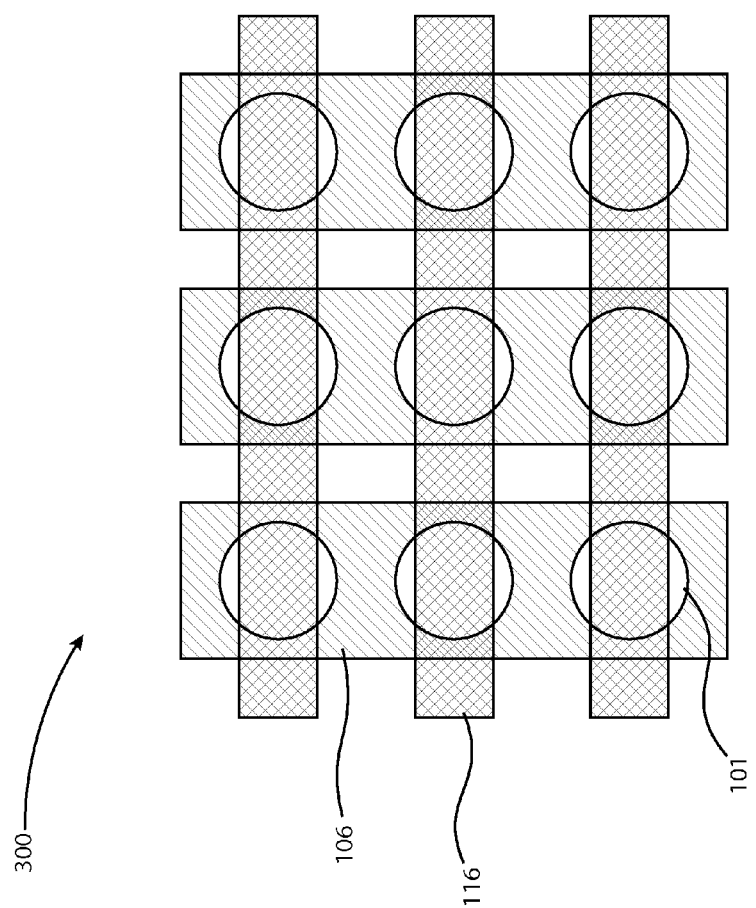
FIG. 3 depicts a top-down view of a line-space patterned memory array device, in accordance with one embodiment of the present invention.

FIG. 3 depicts a top-down view of a line-space patterned memory array device, in accordance with one embodiment of the present invention. In this embodiment, each of the gate conductors 106 is patterned as a rectangle with a plurality of holes surrounding the memory cells 101 along the first axis (running vertically in FIG. 3).

Figure 4:
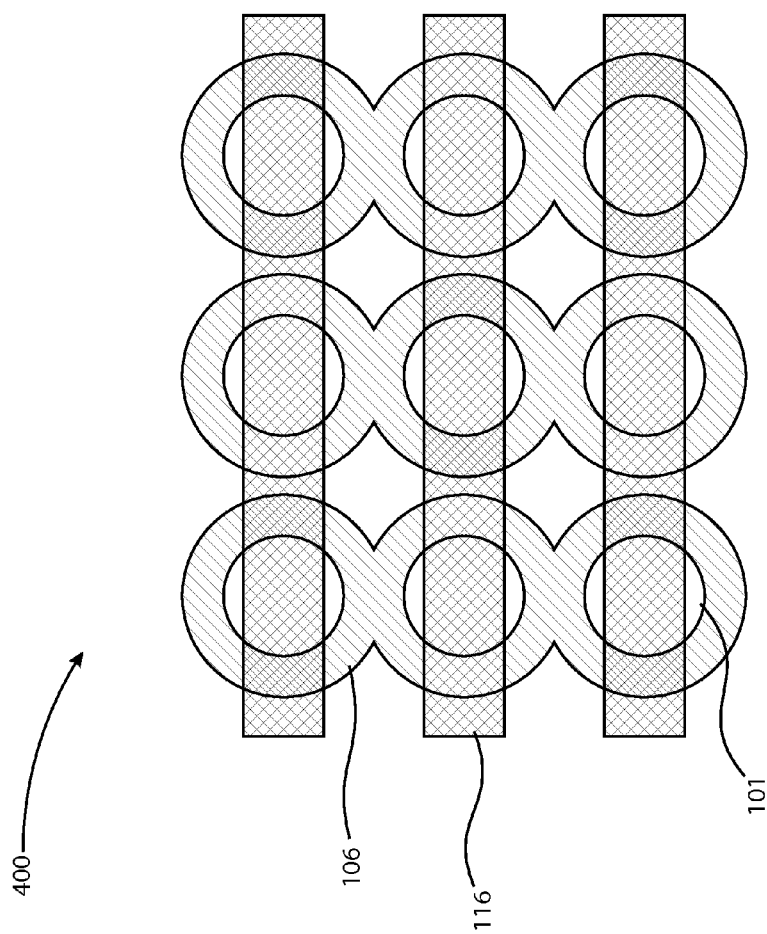
FIG. 4 depicts a top-down view of a fused-circle pattern memory array device, in accordance with one embodiment of the present invention.

FIG. 4 depicts a top-down view of a fused-circle patterned memory array device, in accordance with one embodiment of the present invention. In this embodiment, each of the gate conductors 106 is patterned as overlapping rings surrounding the memory cells 101 the first axis (running vertically in FIG. 4).

Figure 5:
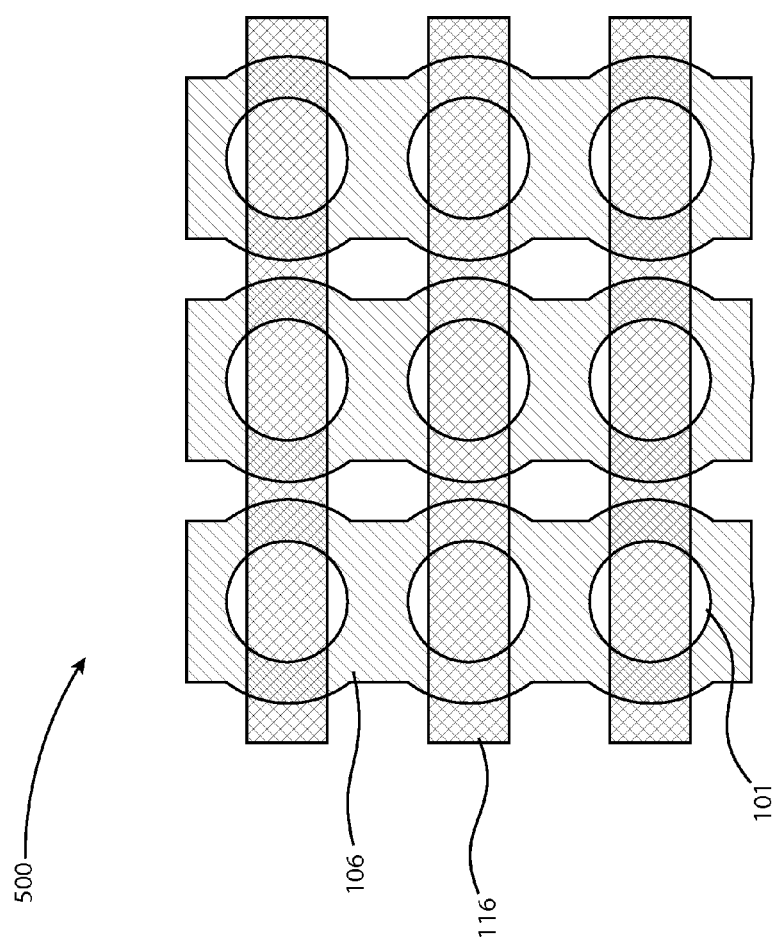
FIG. 5 depicts a top-down view of a spaced-circle memory array device, in accordance with one embodiment of the present invention.

FIG. 5 depicts a top-down view of a spaced-circle patterned memory array device, in accordance with one embodiment of the present invention. In this embodiment, each of the gate conductors 106 is patterned as alternating ring portions and rectangular portions along the first axis (running vertically in FIG. 5), each of the ring portions surround one of the memory cells 101.

Figure 6:
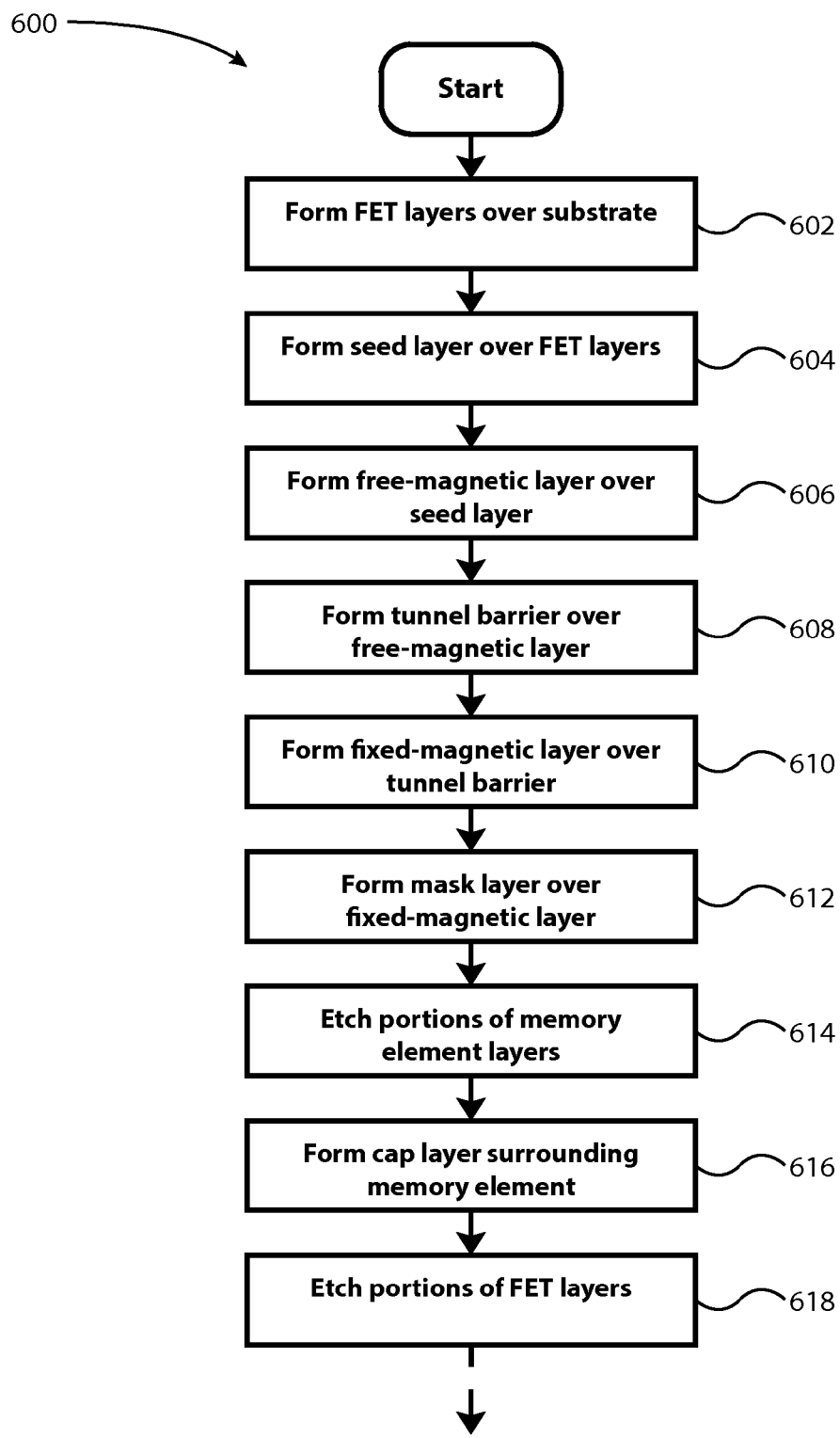
FIGS. 6 and 7 are flowcharts depicting a method for fabricating a memory array device, in accordance with one embodiment of the present invention.
Figure 7:
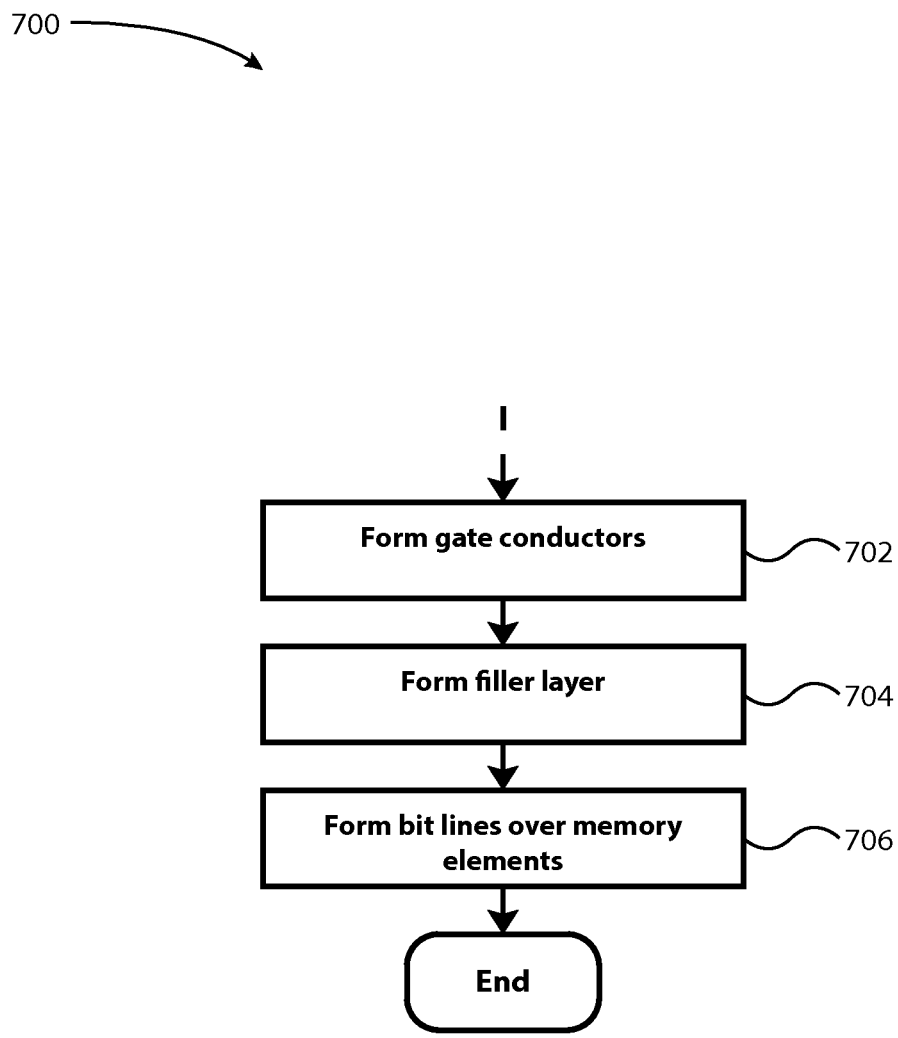

FIGS. 6 and 7 are flowcharts depicting a method for fabricating a memory array device, in accordance with one embodiment of the present invention. The method begins with forming step 602. At forming step 602, the plurality of field effect transistor (FET) layers 104 are formed over a substrate 103. The FET layers 104 can be formed by successively doping the substrate 103 material to produce alternating n-type and p-type semiconductor layers. The FET layers 104 may be epitaxially formed. After forming step 602, the method proceeds to forming step 604.

At forming step 604, the seed layer 109 is formed over the FET layers 104. As mentioned above, the seed layer 109 is configured to promote magnetic anisotropy for the memory element layers and provide ohmic contact between the FET 102 and the memory element 108. To fulfill the functions of seed layers it can be made of many sub-layers, some of which can be atomically thick. For example, a first sub-layer can provide ohmic contact, a second sub-layer can compensate lattice mismatch and the third sub-layer can promote perpendicular anisotropy in free layer. Additionally, between these layers may be several mono-layers of other materials to promote layer by layer growth of the whole structure. After forming step 604, the method proceeds to forming step 606.

At forming step 606, the free-magnetic layer 110 is epitaxially grown over the seed layer 109. Epitaxial growth may be achieved through various techniques including variations of chemical vapor deposition (CVD) or atomic layer deposition (ALD). After forming step 606, the method proceeds to forming step 608. At forming step 608, the tunnel barrier 112 is epitaxially grown over the free-magnetic layer 110. As mentioned above, the tunnel barrier can be comprised of insulating or semiconducting materials. In order to compensate for mismatch between the crystal lattices of the free-magnetic layer 110 and tunnel barrier 112 and to enhance tunnel magneto resistance, sub-nanometer thick amorphous CoFeB layers can be used on both sides of the tunnel barrier 112. After forming step 608, the method proceeds to forming step 610. At forming step 610, the fixed-magnetic layer 114 is epitaxially grown over the tunnel barrier 112. In this embodiment, the metallic cap layer 115 is formed over the fixed-magnetic layer 114. After forming step 610, the method proceeds to forming step 612.

At forming step 612, a mask layer is formed over the memory element layers. In this embodiment, the mask layer is formed directly over the fixed-magnetic layer 114. The mask layer is patterned as an array of "dots" to define the memory cell pillars. One skilled in the art would recognize that the mask layer may be formed utilizing many different techniques, including conductive and non-conductive hard masks. After forming step 612, the method proceeds to etching step 614.

At etching step 614, portions of the memory element layers are etched to define the memory elements 108. The mask layer may be removed after the etch process. After forming step 614, the method proceeds to forming step 616.

At forming step 616, the encapsulation layer 204 is formed surrounding the memory elements 108. The encapsulation layer 204 may be comprised from a dielectric material. In some embodiments, the encapsulation layer 204 is conformally deposited and directionally etched. As such, the encapsulation layer 204 may be designed as an encapsulation layer, protecting the sidewalls of the memory elements 108 during the subsequent etches. Additionally, the encapsulation layer 104 may be configured to decrease the capacitance between the gate conductors 106 and the memory elements 108. The encapsulation layer 204 may also be utilized as a mask to produce FETs 102 with diameters substantially larger than the memory elements 108. After forming step 616, the method proceeds to etching step 618.

At etching step 618, portions of the FET layers 104 are etched to define the FETs 102 and memory cell pillars. After etching step 618, the method proceeds to forming step 702.

At forming step 702, the gate conductors 106 are formed along a first axis, aligned in parallel. The gate conductors 106 are self-aligned to laterally surround a plurality of FETs 102 along the first axis. After forming step 702, the method proceeds to forming step 704.

At forming step 704, a filler layer 118 is formed as an insulator between the memory cells 101. After forming step 704, the method proceeds to forming step 706. At forming step 706, the bit lines 116 are formed along the second axis, in parallel. One skilled in the art would recognize that many techniques may be utilized to form the bit lines, including damascene and subtractive etch methods. The bit lines 116 each electrically coupled to a plurality of memory elements 108 along the second axis. As mentioned above, the second axis is perpendicular to the first axis. After forming step 706, the method is complete.

Figure 8:
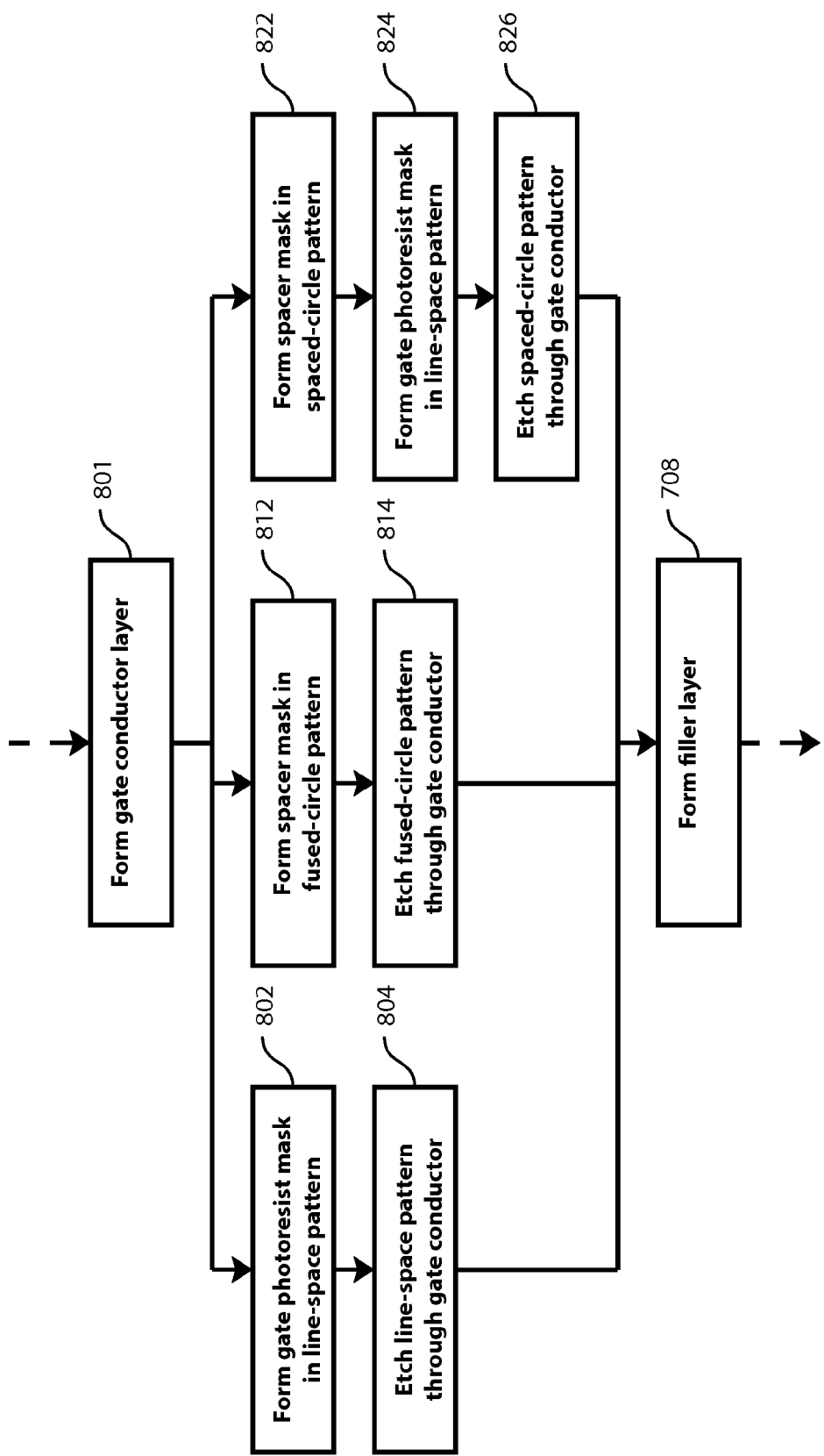
FIG. 8 is a flowchart depicting different methods for forming the gate conductors, in accordance to embodiments of the present invention.

FIG. 8 is a flowchart depicting different methods for forming the gate conductors 106, in accordance to embodiments of the present invention. The flowcharts represent sub-steps of forming step 702. The methods continue from etching step 618 and begin with forming step 801. At forming step 801, a gate oxide and gate conductor layer is formed over and around the memory cell pillars. The gate conductor layer is planarized and recessed below the memory element 108 height. After forming step 801, the method may proceed to forming steps 802, 812, or 814.

In the case of the embodiment depicted in FIG. 3, forming step 801 proceeds to forming step 802. At forming step 802, a gate photoresist mask is formed over the gate conductor layer in a line-space pattern. After forming step 802, the method proceeds to etching step 804. At etching step 804, the line-space pattern is etched into the gate conductor layer, defining each of the gate conductors 106 as a rectangle with a plurality of holes surrounding the memory cells 101 along the first axis. After etching step 804, the method proceeds to forming step 708.

In the case of the embodiment depicted in FIG. 4, forming step 801 proceeds to forming step 812. At forming step 812, a spacer mask is formed over the gate conductor layer in a fused-circle pattern. After forming step 812, the method proceeds to etching step 814. At etching step 814, the fused-circle pattern is etched into the gate conductor layer, defining each of the gate conductors 106 as a plurality of overlapping rings surrounding the memory cells 101 along the first axis. After etching step 814, the method proceeds to forming step 708. It should be noted that a similar embodiment can be achieved by utilizing a gate conductor spacer around the FETs 102.

In the case of the embodiment depicted in FIG. 5, forming step 801 proceeds to forming step 822. At forming step 822, a spacer mask is formed over the gate conductor layer in a spaced-circle pattern. After forming step 822, the method proceeds to forming step 824. At forming step 824, a gate photoresist mask is formed in a line-space pattern. After forming step 824, the method proceeds to etching step 826. At etching step 826, the spaced-circle pattern is etched into the gate conductor layer, defining each of the gate conductors 106 is defined as a plurality of alternating ring and rectangular portions along the first axis, each of the ring portions surround one of the memory cells 101. After etching step 826, the method proceeds to forming step 708.

Figure 9:
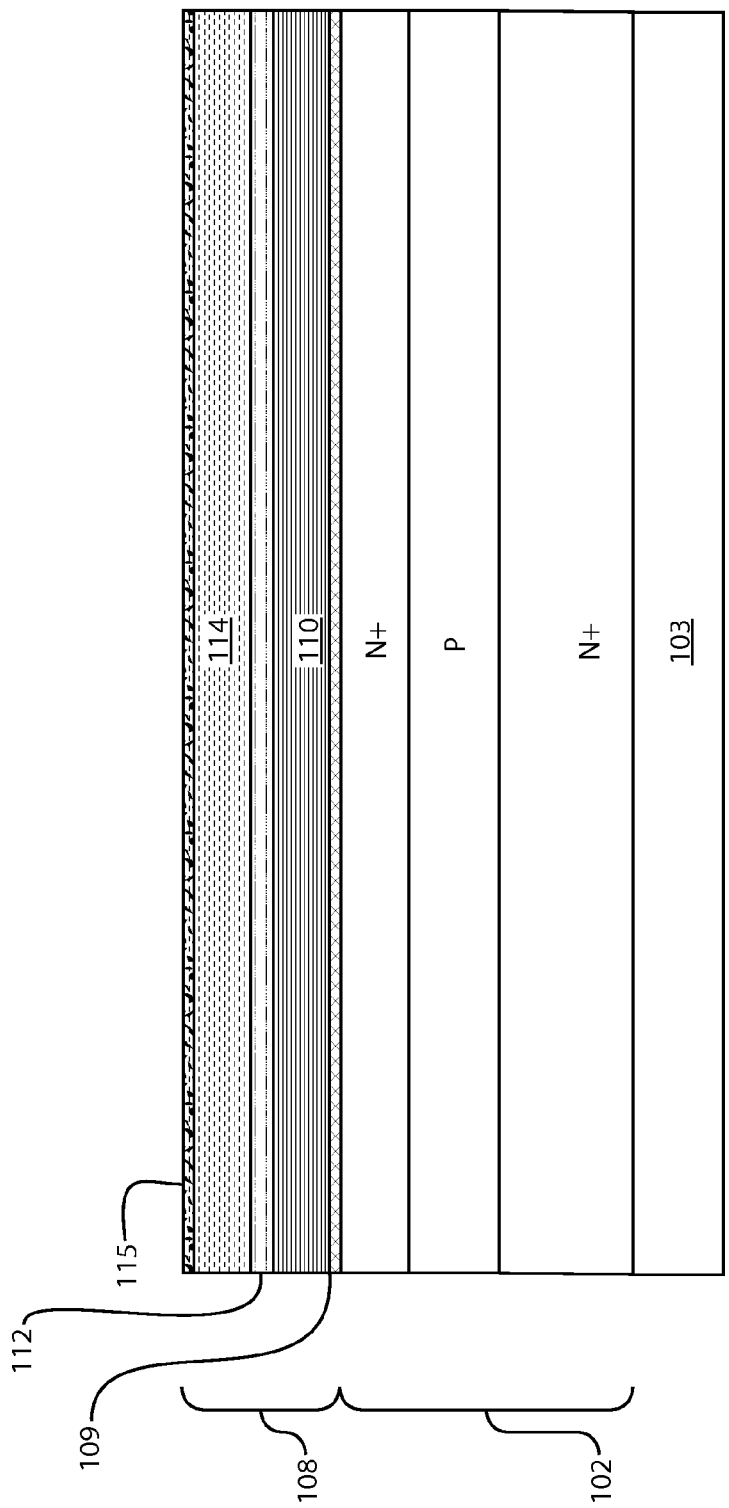
FIGS. 9-11 depict intermediary steps throughout fabrication of a memory array device, in accordance with one embodiment of the present invention.

FIG. 9 depicts an intermediary step during fabrication of a memory array device, in accordance with one embodiment of the present invention. FIG. 9 shows the memory array device after forming step 612. As depicted, all layers formed at this point are unpatterned and are each substantially planar. As such epitaxial growth of the memory element 108 layers results in higher quality memory elements 108.

Figure 10:
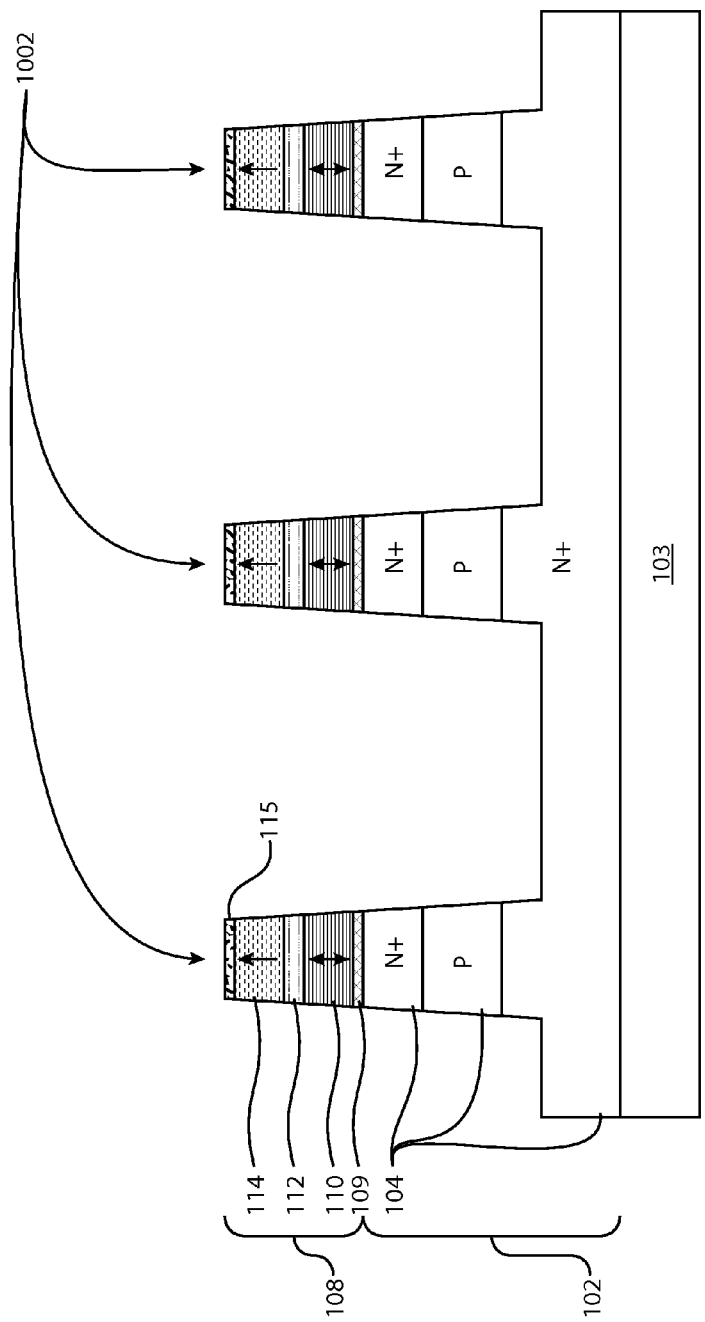

FIG. 10 depicts an intermediary step during fabrication of a memory array device, in accordance with one embodiment of the present invention. FIG. 10 shows the memory array device after etching step 618. The figure displays the memory cell pillars 1002 resulting from etching the FET layers 104.

Figure 11:
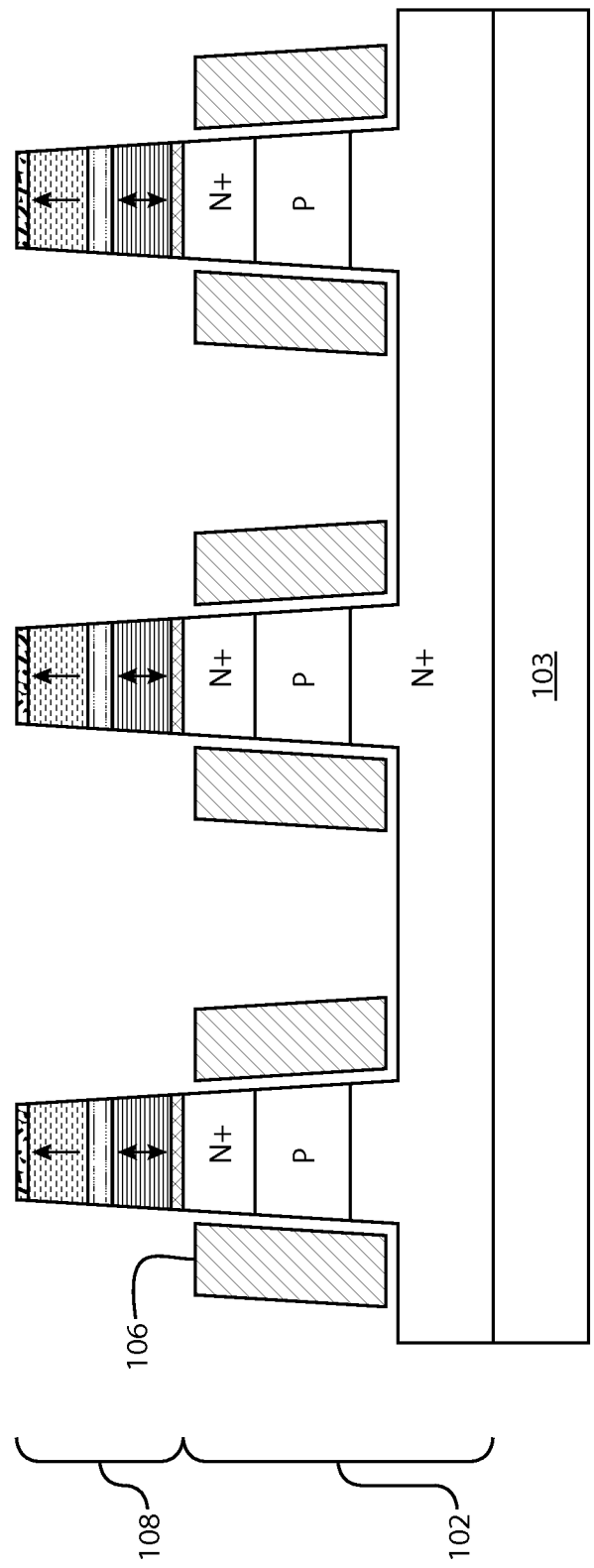

FIG. 11 depicts an intermediary step during fabrication of a memory array device, in accordance with one embodiment of the present invention. FIG. 11 shows the memory array device after forming step 702.

The flowcharts and diagrams in the Figures illustrate the architecture, functionality, and fabrication of possible implementations of a memory array device according to various embodiments of the present invention. It should be noted that, in some alternative implementations, the fabrication steps depicted in the flowchart and description may occur out of the order noted, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array device comprising:
   a plurality of memory cells, each memory cell including:
   (a) a field effect transistor (FET) over a substrate; and
   (b) a memory element electrically coupled to the FET, the memory element including a plurality of memory element layers wherein the memory element layers are epitaxially grown directly on top of the FET;
   a plurality of gate conductors configured along a first axis in parallel, wherein each gate conductor laterally surrounds a plurality of FETs of the memory cells along the first axis; and
   a plurality of bit lines configured along a second axis in parallel, wherein each bit line is electrically coupled to a plurality of memory elements of the memory cells along the second axis, the second axis being perpendicular to the first axis.

2. The memory array device of claim 1, wherein the FET includes a plurality of FET layers, the plurality of FET layers including alternating layers of n-type doped silicon and p-type silicon.

3. The memory array device of claim 1, wherein each memory cell includes a seed layer between the memory element and the FET, the seed layer including a plurality of sub-layers configured to fulfill the following functions:
   (a) provide ohmic contact between the FET and the memory element;
   (b) promote magnetic anisotropy for the memory element layers; and
   (c) compensate mismatch between the FET crystal lattices and memory element crystal lattices.

4. The memory array device of claim 1, wherein each memory cell includes an encapsulation layer surrounding the memory element, the encapsulation layer providing ohmic contact between the memory element and bit line.

5. The memory array device of claim 1, wherein the space between the plurality of gate conductors is substantially less than the space between the plurality of bit lines.

6. The memory array device of claim 1, wherein each of the gate conductors is patterned as a rectangle with a plurality of holes surrounding the memory cells along the first axis.

7. The memory array device of claim 1, wherein each of the gate conductors is patterned as overlapping rings surrounding the memory cells along the first axis.

8. The memory array device of claim 1, wherein each of the gate conductors is patterned as alternating ring portions and rectangular portions along the first axis, each of the ring portions surround one of the memory cells.

9. The memory array device of claim 1, wherein the diameters of the FETs are substantially greater than the diameters of the memory elements.

10. A memory array device comprising:
    a plurality of memory cells, each memory cell including:
    (a) a field effect transistor (FET) over a substrate, the FET including a top FET layer; and
    (b) a memory element electrically coupled to the FET, the memory element including a plurality of memory element layers, the memory element layers having the same crystalline orientation as the top FET layer;
    a plurality of gate conductors configured along a first axis in parallel, wherein each gate conductor laterally surrounds a plurality of FETs of the memory cells along the first axis; and
    a plurality of bit lines configured along a second axis in parallel, wherein each bit line is electrically coupled to a plurality of memory elements of the memory cells along the second axis, the second axis being perpendicular to the first axis.

11. The memory array device of claim 10, wherein the FET includes a plurality of FET layers, the plurality of FET layers including alternating layers of n-type doped silicon and p-type silicon.

12. The memory array device of claim 10, wherein each memory cell includes a seed layer between the memory element and the FET, the seed layer including a plurality of sub-layers configured to fulfill the following functions:
    (a) provide ohmic contact between the FET and the memory element;
    (b) promote magnetic anisotropy for the memory element layers; and
    (c) compensate mismatch between the FET crystal lattices and memory element crystal lattices.

13. The memory array device of claim 10, wherein each memory cell includes an encapsulation layer surrounding the memory element, the encapsulation layer providing ohmic contact between the memory element and bit line.

14. The memory array device of claim 10, wherein the space between the plurality of gate conductors is substantially less than the space between the plurality of bit lines.

15. The memory array device of claim 10, wherein each of the gate conductors is patterned as a rectangle with a plurality of holes surrounding the memory cells along the first axis.

16. The memory array device of claim 10, wherein each of the gate conductors is patterned as overlapping rings surrounding the memory cells along the first axis.

17. The memory array device of claim 10, wherein each of the gate conductors is patterned as alternating ring portions and rectangular portions along the first axis, each of the ring portions surround one of the memory cells.

18. The memory array device of claim 10, wherein the diameters of the FETs are substantially greater than the diameters of the memory elements.

* * * * *